United States Patent [19]
Natarajan

[11] Patent Number: 5,625,166
[45] Date of Patent: Apr. 29, 1997

[54] STRUCTURE OF A THERMALLY AND ELECTRICALLY ENHANCED PLASTIC PIN GRID ARRAY (PPGA) PACKAGE FOR HIGH PERFORMANCE DEVICES WITH WIRE BOND INTERCONNECT

[75] Inventor: Slva Natarajan, Gilbert, Ariz.

[73] Assignee: Intel Corporation, Santa Clara, Calif.

[21] Appl. No.: 333,144

[22] Filed: Nov. 1, 1994

[51] Int. Cl.⁶ .................................................. H01L 23/02
[52] U.S. Cl. ................................ 174/52.4; 361/752
[58] Field of Search ............................... 174/52.1–52.4; 361/728, 736, 752; 439/91; 437/209, 214, 215, 217, 218

[56] References Cited

U.S. PATENT DOCUMENTS 5,102,829  4/1992  Cohn ............................................ 437/217
5,130,889  7/1992  Hambergen et al. ...................... 361/388
5,357,672  10/1994  Newman .................................... 29/830

Primary Examiner—Kristine L. Kincaid
Assistant Examiner—Robert J. Decker
Attorney, Agent, or Firm—Blakely, Sokoloff, Taylor & Zafman

[57] ABSTRACT

An integrated circuit package that contains a multi-layer printed circuit board that is coupled to a plurality of external mounting pins and an integrated circuit. The multi-layered circuit board has a plurality of inner bonding pads that are coupled to the integrated circuit and routed directly to the pins without use of any vias. The printed circuit board has multiple voltage/ground layers so that different power levels can be supplied to the integrated circuit board. The integrated circuit is mounted and electrically grounded to a heat slug that is also coupled to the printed circuit board. The heat slug provides the dual function of a ground plane and a thermal sink for the package. The pins and package are typically configured in a conventional PPGA package arrangement.

11 Claims, 3 Drawing Sheets

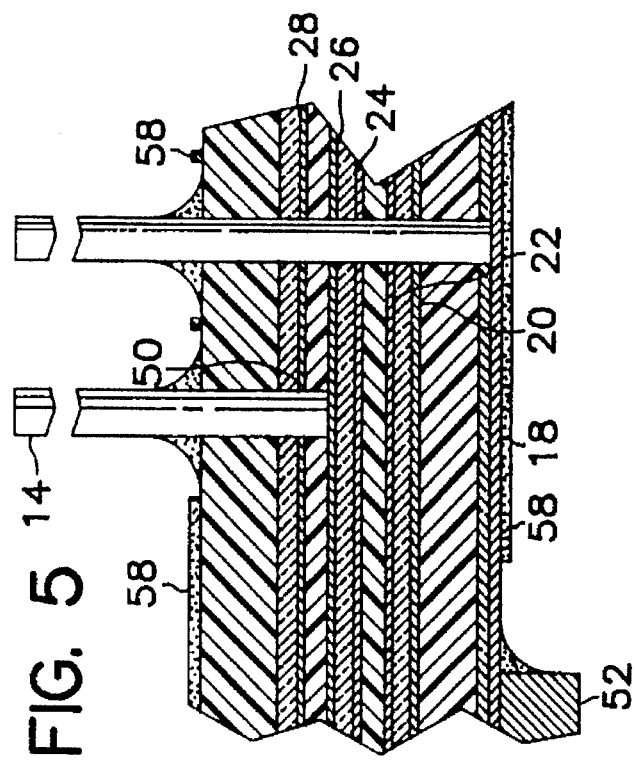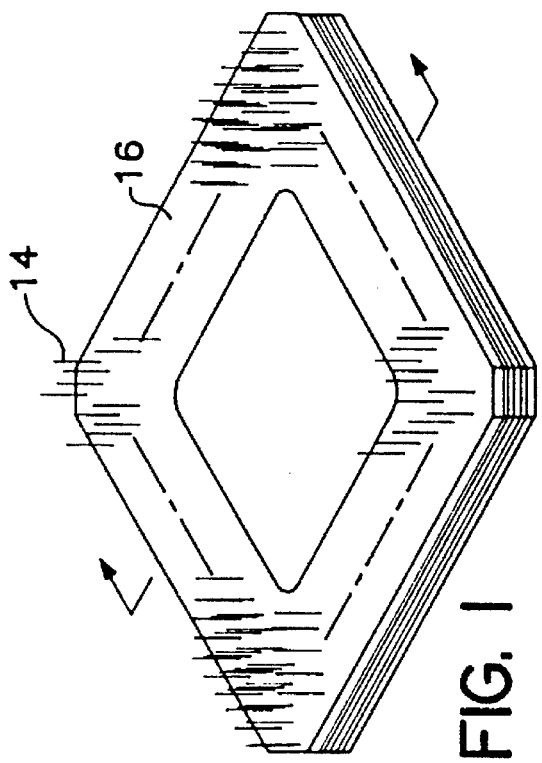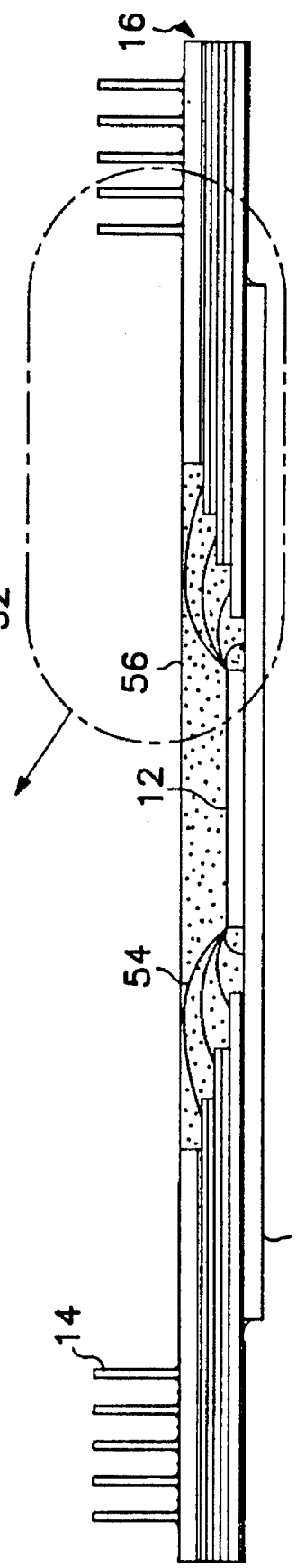

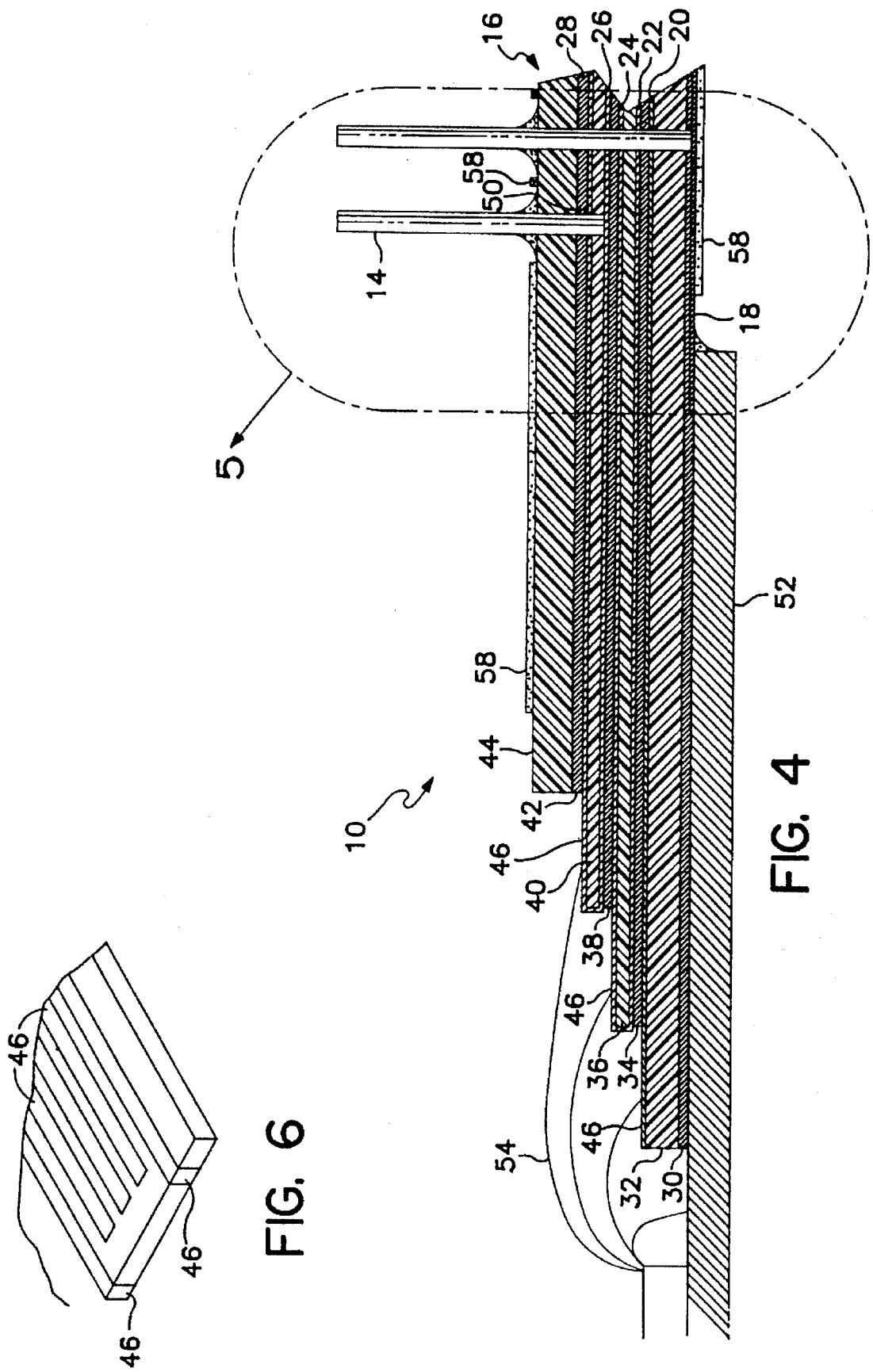

STRUCTURE OF A THERMALLY AND ELECTRICALLY ENHANCED PLASTIC PIN GRID ARRAY (PPGA) PACKAGE FOR HIGH PERFORMANCE DEVICES WITH WIRE BOND INTERCONNECT

BACKGROUND OF THE INVENTION

1. Field of the Invention

The present invention relates to an integrated circuit package.

2. Description of Related Art

Integrated circuits (ICs) are typically housed in packages that can be mounted to a printed circuit board. One type of integrated circuit package is a plastic pin grid array (PPGA). A typical PPGA package has an inner cavity which contains the integrated circuit and is enclosed by either a lid or an encapsulant material. Within the inner cavity are a plurality of inner bonding pads that are coupled to the IC by wire bonds or a TAB (tape automated bonding) tape. The inner pads are coupled to pins that extend from the outer surface of the package and are connected to the printed circuit board.

The inner bonding pads are typically routed to the pins by vias that couple the pads to an internal conductive layer. Forming vias is a relatively time consuming and expensive process. It would therefore be desirable to provide a PPGA package that can be constructed without using vias.

Integrated circuits are constructed to run at different power levels. For example, integrated circuits used in desktop computers may run on 5 V power supply, while circuits used in laptop computers may run on a 3.3 V power supply. To reduce tooling cost, etc. it would be desirable to provide a single PPGA device that can package various ICs product which operate on different power levels.

SUMMARY OF THE INVENTION

The present invention is an integrated circuit package which contains a multi-layer printed circuit board that is coupled to a plurality of external mounting pins and an integrated circuit. The multi-layered circuit board has a plurality of inner bonding pads that are coupled to the integrated circuit and routed directly to the pins without use of any vias. The printed circuit board has multiple voltage/ground layers so that different power levels can be supplied to the integrated circuit board. The integrated circuit is mounted and electrically grounded to a heat slug that is also coupled to the printed circuit board. The heat slug provides the dual function of a ground plane and a thermal sink for the package. The pins and package are typically configured in a conventional PPGA package arrangement.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a perspective view of an integrated circuit package of the present invention;

FIG. 2 is a side cross-sectional view of the package of FIG. 1;

FIG. 4 is an enlarged sectional view of the package of FIG. 2;

FIG. 5 is an enlarged sectional view of the package of FIG. 4;

FIG. 6 is a perspective view showing bonding pads that wrap around to an adjacent conductive plane.

DETAILED DESCRIPTION OF THE INVENTION

Figure 3:
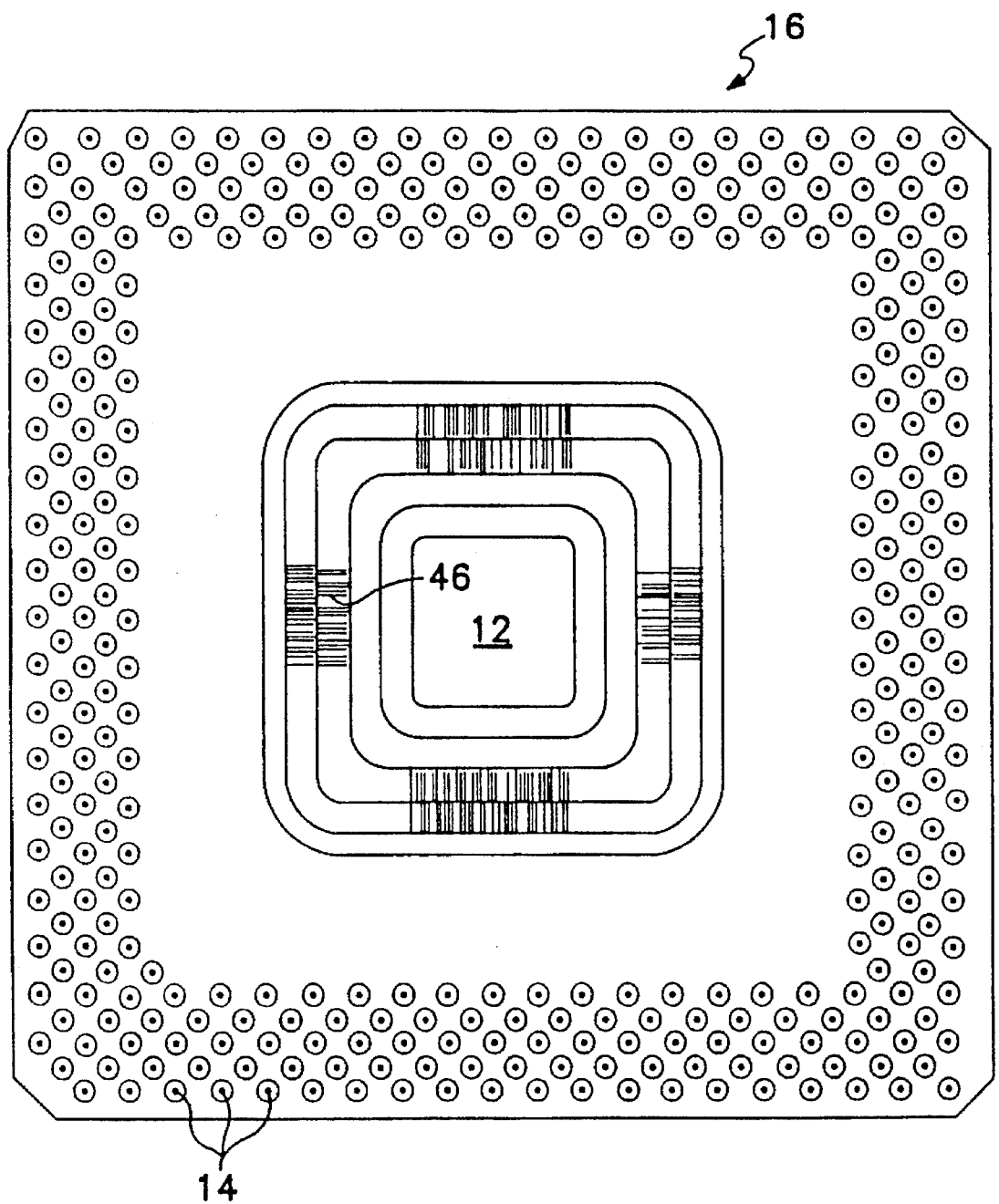
FIG. 3 is a top cross-sectional view of the package of FIG. 1.

Referring to the drawings more particularly by reference numbers, FIGS. 1–5 show an integrated circuit package 10 of the present invention. The package 10 houses an integrated circuit 12 such as a microprocessor. Although an integrated circuit 12 is described and shown, it is to be understood that the package may contain other electrical devices. The package 10 has a plurality of external mounting pins 14. The mounting pins 14 are typically soldered to either surface pads or the plated through holes of an external printed circuit board (not shown). The pins 14 are preferably gold plated Kovar and are located within an arrangement that corresponds to a conventional plastic pin grid array package (PPGA). Thus the package 10 of the present invention can be plugged into the holes of a conventional external printed circuit board. In the preferred embodiment, the package 10 contains 296 pins 14.

The package 10 contains a multi-layer printed circuit board 16. The circuit board 16 has a number of conductive layers 18–28 separated by dielectric layers 30–44. The conductive layers 20–28 have inner bonding pads 46 located within an inner cavity 48 of the package 10. In the preferred embodiment, the multi-layer printed circuit board is constructed from four different conventional printed circuit boards that have conductive lines/planes on one or both sides of a hard dielectric substrate (32, 36, 40 and 44). The substrate may be a glass filled epoxy or other conventional printed circuit board material. The printed circuit boards are typically bonded together with an adhesive such as a polyimide (30, 34, 38, and 42). Constructing the package 10 with conventional printed circuit board technology decreases the cost of developing and producing the multi-layer package 10. The conductive layers of the multi-layer printed circuit board are constructed to transmit both power and digital signals, wherein the digital signals are typically carried by individual leads and power is supplied on conductive planes. In the preferred embodiment, conductive layers 18 and 26 are dedicated to ground (VSS), conductive layers 20 and 22 provides power (VCC), and layers 24 and 28 carry digital signals. Each power layer can provide a different level of power. For example, the conductive layer 20 can be coupled to a 5 V power supply and conductive layer 22 can be coupled to a 3.3 V power supply. The integrated circuit 12 can be wire bonded to one or both power layers 20 and 22 depending upon the power requirements of the circuit 12.

The bonding pads 46 are located within tiered ledges of the package 10. The conductive layers 18–28 also contain a plurality of conductive plated through holes 50. The pins 14 are soldered to the plated through holes 50 to provide an interconnect between the pins 14 and the bonding pads 46. The bonding pads 46 are routed directly to the plated through holes without using any vias. As shown in FIG. 6, some of the bonding pads 46 wrap around the end of the dielectric material and are connected to an adjacent conductive layer. The wrap around feature provides an interconnect between the bonding pads and the conductive planes without using any vias.

Attached to the printed circuit board 16 is a heat slug 52. The heat slug 52 is preferably constructed from a material such as copper that is both thermally and electrically conductive. The heat slug may be nickel and gold plated to provide a wire bonding surface. The heat slug 52 is soldered to conductive layer 18. The conductive layer 18 is coupled to some of the pins 14, so that the heat slug 18 is electrically coupled to the pins 14. Mounted to the heat slug 52 is the integrated circuit 12. The ground pads of the integrated circuit 12 are soldered to the heat slug 52 with wire bonds 54. The heat slug 52 and conductive layer 18 provide a ground plane for the package and electrically couple the circuit 12 to the pins 14. The heat slug 52 thus provides the dual functions of a ground plane and a thermal sink.

The integrated circuit 12 also contains outer surface pads (not shown) that are Coupled to corresponding inner bonding pads 46 by wires 54. The wires 54 can be attached to the circuit 12 and the bonding pads 46 by conventional wire bonding techniques. After the integrated circuit 12 is bonded to the printed circuit board the inner cavity 48 is filled with an encapsulant 56 that encloses the circuit 12. As an alternate embodiment, a lid may be used to enclose the circuit 12. A solder mask 58 may be applied to the outer surfaces of the package to insulate conductive layer 18 and the pins 14.

To assemble a package 10, the individual printed circuit boards are bonded together by the adhesives to create the multi-layer printed circuit board 16. The individual printed circuit boards can be bonded together using conventional lamination techniques. Before the boards are bonded to together, the conductive planes and traces are etched into a desired pattern to create conductive layers 18–28. The plated through holes are also created before the final multi-layer board is assembled. The heat slug 52 can be mounted to the bottom printed circuit board during the bonding process of the individual boards.

After the multi-layer board 16 is assembled, the pins 14 are soldered to the plated through holes 50 of the board 16. The solder mask 58 is then typically applied to the outer surfaces of the circuit board. The circuit board/pin subassembly is typically shipped as a separate unit for subsequent usage with an integrated circuit.

The integrated circuit 12 is mounted to the heat slug 52 and wire bonded to the printed circuit board 16. The package may then be tested and filled with an encapsulant 56 to enclose the circuit 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package assembly, comprising:
   a printed circuit board that has a shelf with an edge and a plurality of inner bonding pads that wrap around said edge and are connected to an inner conductive layer of said printed circuit board, said inner conductive layer being routed directly to a plurality of conductive holes;
   a plurality of pins coupled to said conductive holes; and,
   an integrated circuit coupled to said inner bonding pads.

2. The assembly as recited in claim 1, wherein said printed circuit board has a plurality of conductive layers.

3. The assembly as recited in claim 1, further comprising a heat slug that supports said integrated circuit and is coupled to said printed circuit board.

4. The assembly as recited in claim 3, wherein said heat slug is electrically coupled to said integrated circuit and said pins.

5. The assembly as recited in claim 2, wherein said printed circuit board has a plurality of power layers.

6. An integrated circuit package assembly, comprising:
   a multi-layer printed circuit board which contains a plurality of internal conductive layers, a plurality of edges, and a plurality of inner bonding pads that wrap around said edges and are connected to said internal conductive layers, said internal conductive layers being routed directly to a plurality of conductive holes;
   a plurality of pins coupled to said conductive holes;
   an integrated circuit coupled to said inner bonding pads; and,
   a heat slug attached to said multi-layer printed circuit board and electrically coupled to said integrated circuit and said pins.

7. The assembly as recited in claim 6, wherein said multi-layer printed circuit board has a plurality of power layers.

8. A method for assembling an integrated circuit package, comprising the steps of:
   a) attaching a plurality of pins to a plurality of plated holes in a multi-layer printed circuit board, wherein said printed circuit board has a plurality of inner bonding pads that wrap around an edge of said printed circuit board to an internal conductive layer that is routed to said plated holes;
   b) mounting a heat slug to said multi-layer printed circuit board;
   c) mounting an integrated circuit to said heat slug;
   d) coupling said integrated circuit to said multi-layer printed circuit board.

9. The method as recited in claim 8, further comprising the step of enclosing said integrated circuit.

10. The method as recited in claim 9, wherein said step of coupling said integrated circuit to said multi-layer printed circuit board is performed by wire bonding.

11. The method as received in claim 8, wherein said heat slug is electrically coupled to said integrated circuit and said multi-layer printed circuit board.

* * * * *

UNITED STATES PATENT AND TRADEMARK OFFICE
CERTIFICATE OF CORRECTION

PATENT NO. : 5,625,166 Page 1 of 1
APPLICATION NO. : 08/333144
DATED : April 29, 1997
INVENTOR(S) : Siva Natarajan and Jim Deweese It is certified that error appears in the above-identified patent and that said Letters Patent is hereby corrected as shown below:

On Title Page
Item [19], United State Patent – Natarajan, should read as follows:

-- "United States Patent
 Natarajan, et al." --

Item [75], Inventor, please add:

-- "Jim Deweese, Placerville, California" --

Signed and Sealed this

Thirty-first Day of July, 2007

JON W. DUDAS
*Director of the United States Patent and Trademark Office*